United States Patent [19]

Eklund et al.

[11] Patent Number: 5,320,971

[45] Date of Patent: Jun. 14, 1994

[54] PROCESS FOR OBTAINING HIGH BARRIER SCHOTTKY DIODE AND LOCAL INTERCONNECT

[75] Inventors: Robert H. Eklund, Plano; Robert H. Havemann, Garland, both of Tex.

[73] Assignee: Texas Instruments Incorporated, Dallas, Tex.

[21] Appl. No.: 908,761

[22] Filed: Jul. 1, 1992

Related U.S. Application Data

[63] Continuation of Ser. No. 593,713, Oct. 5, 1990, abandoned.

[51] Int. Cl.$^5$ .................. H01L 21/265; H01L 21/70
[52] U.S. Cl. ........................... 437/31; 437/39; 437/178; 437/200
[58] Field of Search ............ 437/31, 39, 178, 200

[56] References Cited

U.S. PATENT DOCUMENTS

| | | | |
|---|---|---|---|
| 4,800,177 | 1/1989 | Nakamae | 437/193 |
| 4,809,052 | 2/1989 | Nishioka et al. | 357/51 |
| 4,978,637 | 12/1990 | Liou et al. | 437/192 |
| 4,988,423 | 1/1991 | Yamamoto et al. | 437/192 |

OTHER PUBLICATIONS

M. Eizenberg et al., "Shallow silicide contacts formed by using codeposited $Pt_2Si$ and $Pt_{1.2}Si$ films", Appl. Phys. Lett. 37(6), Sep. 15, 1980, pp. 547–549.

Primary Examiner—Olik Chaudhuri
Assistant Examiner—Long Pham
Attorney, Agent, or Firm—John D. Crane; Richard Donaldson

[57] ABSTRACT

This invention is a silicon bipolar integrated circuit comprising: a high barrier Schottky diode clamp on a bipolar transistor, the diode clamp comprising a self-aligned PtSi layer on a silicon surface; and a TiN local interconnect partially overlying the PtSi layer. It also is a method of manufacturing an integrated circuit comprising: forming a self-aligned PtSi layer on the adjacent base and collector silicon regions, the PtSi serving as a clamp diode on the bipolar transistor; and forming an etch-patterned TiN layer partially overlying the PtSi layer, the etch-patterned TiN layer serving as local interconnects. The invention provides a PtSi Schottky diode on a bipolar transistor in combination with a TiN local interconnect with the advantages of (i) providing a TiN local interconnect which can be etched without also etching the PtSi, (ii) permitting a wide process window for overetching at contacts, (iii) a TiN local interconnect which is an improvement over a polysilicon local interconnect, and (iv) a high barrier Schottky diode for clamping a bipolar transistor.

16 Claims, 2 Drawing Sheets

PROCESS FOR OBTAINING HIGH BARRIER SCHOTTKY DIODE AND LOCAL INTERCONNECT

This application is a continuation of application Ser. No. 07/593,713 filed Oct. 5, 1990, now abandoned.

BACKGROUND OF THE INVENTION

The present invention relates to electronic semiconductor devices and fabrication methods, and, more particularly, to Schottky barrier diodes including diodes formed in integrated circuits.

Schottky barrier diodes are widely used in integrated circuits in applications such as decoupling devices in digital circuits (silicon bipolar and gallium arsenide MOSFET) and as clamping devices to prevent heavy saturation of bipolar transistors. Generally, a Schottky barrier diode is formed by deposition of suitable barrier metal into a contact opening through a silicon dioxide insulating layer down to bare silicon. The barrier metal may be reacted with the silicon to form a silicide-to-silicon junction (for example Pt is deposited and reacted to form transistor clamping and Ti is deposited and reacted to form TiSi2 and is used as a low barrier diode for logic circuits) or may be left unreacted and form a metal-to silicon junction (for example TiW is used as a low barrier diode and Al as a high barrier diode on n-type silicon). Note that the reaction with silicon: that is, a metal is uniformly deposited but only the portion in contact with bare silicon reacts so the unreacted metal away from the silicon can be selectively removed. Of course, a silicide could be directly deposited which would avoid the need for reaction of the metal with the silicon but would not yield a self-aligned structure.

SUMMARY OF THE INVENTION

Current technology used in BiCMOS processes involve the use of direct react TiSi2 and TiN as a local interconnect. It has been found that several problems exist for this technology. First of all, oxide etches are not very selective to TiSi2. This can result in the contact etch going all of the way through the silicide and into the doped region under it. Second, the problem with the TiN (or other refractory metal, especially W or TiW) local interconnect process is that the dry etches which etch TiN also etch TiSi2, thereby limiting the amount of overetch that can be used. Third, the titanium silicide Schottky diode has a low barrier height (about 0.55 V) which is not high enough to effectively form a clamp on a bipolar transistor. The low barrier height also means high leakage currents at 150 degrees C. (about 0.3 ua/um2).

Other technology which utilizes PtSi Schottky diodes has polysilicon as a local interconnect. A problem with the polysilicon interconnect occurs when connecting to a doped region. The connection between polysilicon and doped regions sometimes forms a diode barrier where one is not desired.

It has also been found that PtSi is not etched by the various oxide etches and that a wide process window for overetching at contacts without danger of etching into the underlying silicon is permitted. The etches used to etch the TiN do not etch the PtSi, whereas they do result in significant etching of the TiSi2 in the old design (the examples comments herein are addressed to TiN, however, other refractory metals and combinations thereof, especially W or TiW, can be substituted for the TiN). The PtSi also provides a higher barrier diode than the TiSi2.

The described embodiments of the present invention provide a high barrier PtSi Schottky diode as a clamp on a bipolar transistor and a TiN local interconnect. In the primary described embodiment, a PtSi layer is formed in a self-aligned manner on the surface of the base and collector silicon regions. The PtSi serves as a clamp diode on the bipolar transistor. A TiN layer is formed over the PtSi layer. The TiN layer serves as the local interconnect. The PtSi diode with a TiN local interconnect provides an improvement over a TiSi2 diode with a TiN interconnect and a PtSi diode with a polysilicon interconnect. The combination of a PtSi diode with a TiN interconnect has apparently never been done before.

This invention is a silicon bipolar integrated circuit comprising: a high barrier Schottky diode clamp on a bipolar transistor, the diode clamp comprising a self-aligned PtSi layer on a silicon surface; and a TiN local interconnect partially overlying the PtSi layer. It also is a method of manufacturing an integrated circuit comprising: forming a self-aligned PtSi layer on the adjacent base and collector silicon regions, the PtSi serving as a clamp diode on the bipolar transistor; and forming an etch-patterned TiN layer partially overlying the PtSi layer, the etch-patterned TiN layer serving as local interconnects. The invention provides a PtSi Schottky diode on a bipolar transistor in combination with a TiN local interconnect with the advantages of (i) providing a TiN local interconnect which can be etched without also etching the PtSi, (ii) permitting a wide process window for overetching at contacts, (iii) a TiN local interconnect which is an improvement over a polysilicon local interconnect, and (iv) a high barrier Schottky.

Preferably, the PtSi layer is formed by sputtering platinum onto a substrate having both oxide and silicon surface regions, heating the substrate to react the platinum with the silicon surface, but leaving unreacted platinum on the oxide surface, and then removing the unreacted platinum with aqua regia, and the etch-patterned TiN layer is formed by depositing titanium over the substrate and reacting the titanium with nitrogen to form titanium nitride, covering the titanium nitride with a patterned photoresist, and etching the titanium nitride to form the etch-patterned TiN. (TiN can also be deposited).

DETAILED DESCRIPTION OF THE PREFERRED EMBODIMENT

Figure 1:
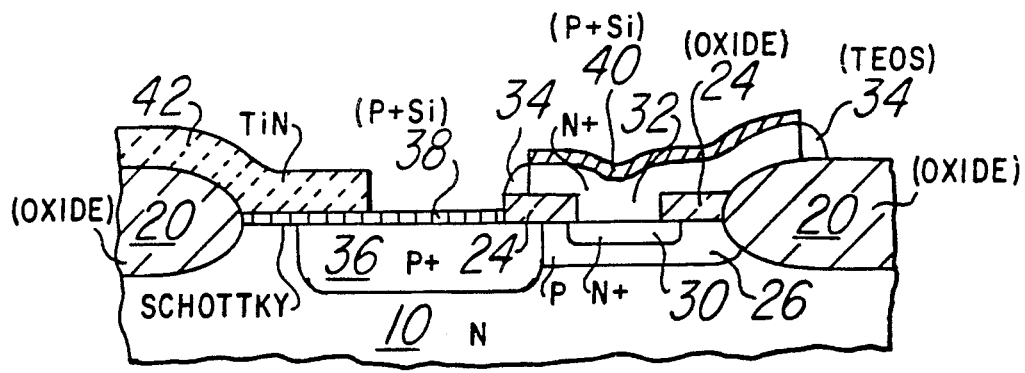
FIGS. 1 through 9 are side view schematic diagrams showing the processing steps of a preferred embodiment of the present invention wherein a platinum silicide Schottky diode with a TiN local interconnect is formed on the surface of the base and collector silicon regions of a transistor.

FIGS. 1 through 9 are side view schematic diagrams showing a preferred embodiment of the present invention and method for forming the same. In FIGS. 1 through 9, PtSi 38 is used to form a Schottky-barrier-clamped n-p-n silicon bipolar transistor with a TiN local interconnect. Referring to FIG. 1, a diagram of a PtSi high barrier Schottky diode and TiN local interconnect constructed according to the invention is shown. The circuit contains n-type silicon substrate (collector) 10, thick oxide isolation 20, silicon dioxide (base oxide)

layer 24, p-type active base 26, n+ emitter 30, n+ polysilicon emitter 32, oxide sidewalls 34, p+ extrinsic base 36, platinum silicide (PtSi) layer 38 which forms a Schottky barrier diode with collector 10 and an ohmic contact with extrinsic base 36, PtSi layer 40, and titanium nitride (TiN) local interconnect 42. Insulation layers, interconnections, electrodes, and packaging are not shown in the Figures for simplicity.

PtSi 38 forms a Schottky barrier diode to clamp the collector-base junction (to a maximum forward bias of 0.5 v) and prevent forward bias saturation. There are several advantages of PtSi diode 38 in combination with TiN local interconnect 42. (i) The etches used to etch the TiN will not etch the PtSi whereas they do result in significant etching of TiSi2. (ii) PtSi is not etched by the various oxide etches thereby permitting a wide process window for overetching at contacts. This is very significant for the bipolar emitter which sees more overetch than the moat regions. (iii) The TiN interconnects provide an improvement over polysilicon interconnects by providing a lower barrier connection to doped regions. (iv) The PtSi has a higher barrier height than TiSi2 occupying the same surface area, about 0.83 V for PtSi and about 0.55 V for TiSi2.

Further features and characteristics of the invention will be apparent from consideration of a preferred embodiment method of fabrication which includes the following steps which are illustrated in cross sectional elevation views in FIGS. 1 through 9.

Figure 2:
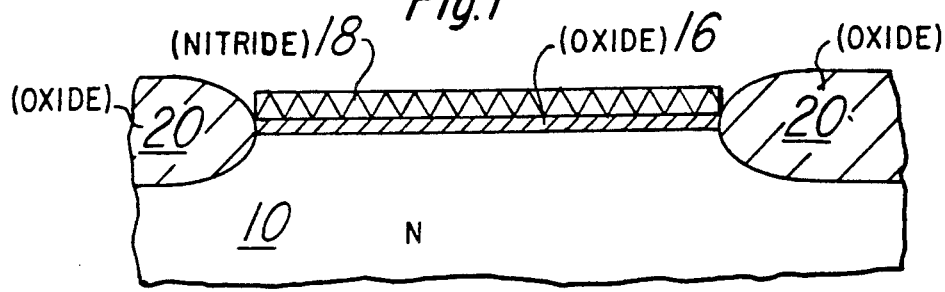
Figure 3:
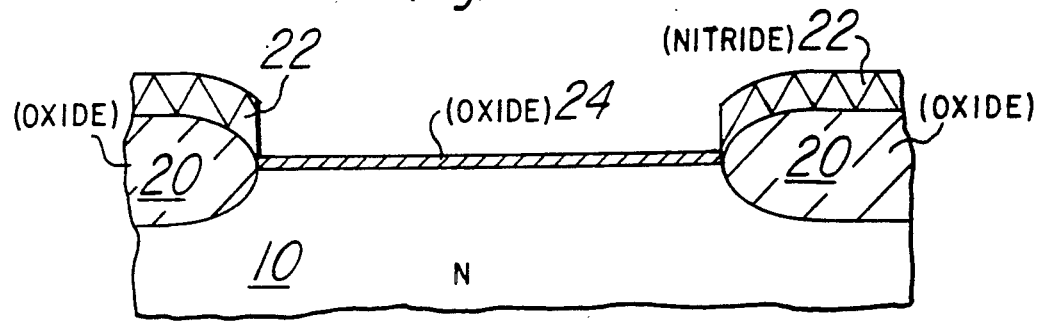
Figure 4:
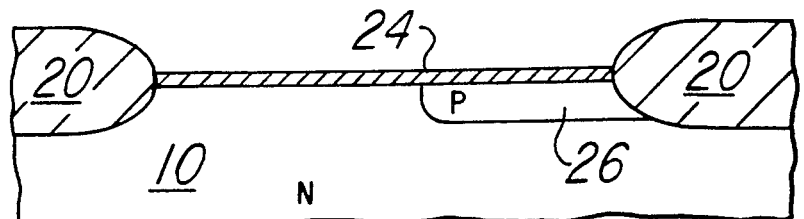
Figure 5:
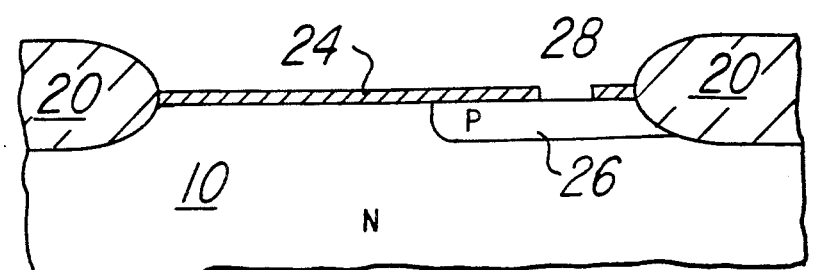

Referring to FIGS. 2 through 9, a method of forming the preferred embodiment of FIG. 1 is described in detail. FIG. 2 illustrates, in cross-section, a partially fabricated circuit formed into an n-type substrate 10. Oxide layer 16 is grown on the surface of n-type substrate 10, followed by nitride layer 18 which is patterned and etched to provide for the formation of thick oxide regions 20. A thermal oxidation step in a steam ambient at approximately 900 degrees C. for approximately 8.5 hours forms silicon dioxide regions 20 to a thickness of approximately 7,000 Angstroms, as shown in FIG. 2. The nitride layer 18 is then removed using wet chemical etching in phosphoric acid. Next, oxide layer 16 is then removed by a wet deglaze. Then base oxide 24 is grown in steam at 900 degrees C. for approximately 59 minutes to form an oxide thickness of approximately 1,400 Angstroms, as shown in FIG. 3.

A photoresist is deposited and patterned to expose the surface of base oxide 24 for the formation of active base 26. Boron is implanted through the exposed oxide to form p-type active base 26. The photoresist is then removed to leave the structure shown in FIG. 4.

Figure 6:
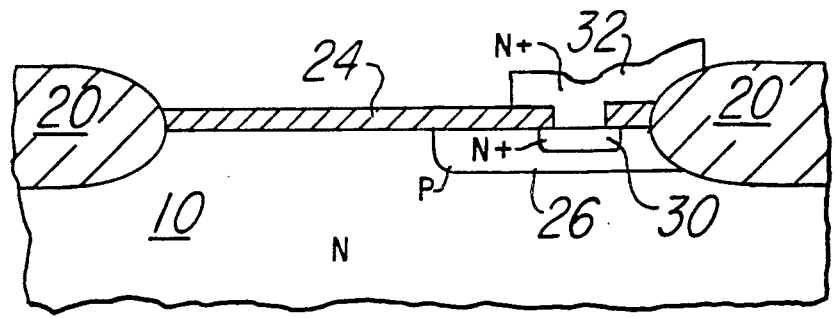
Figure 7:
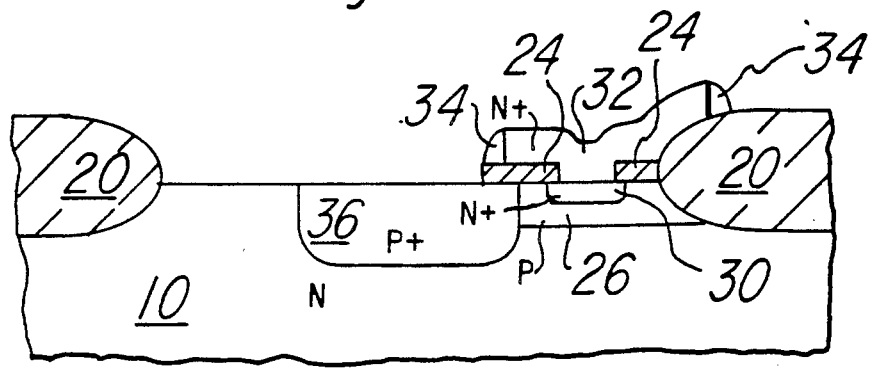
Figure 8:
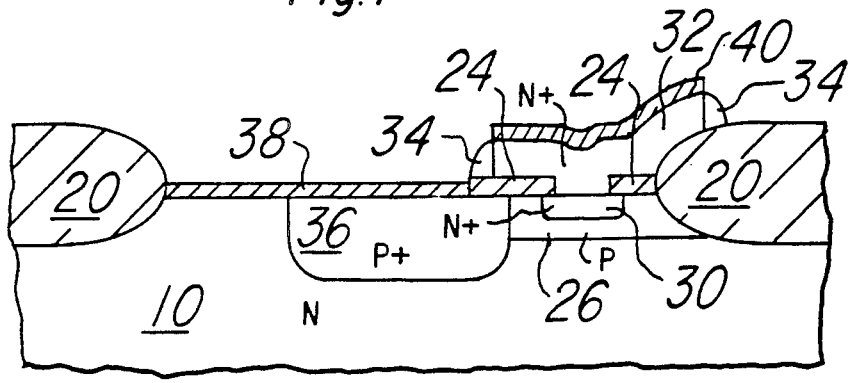

Next, a photoresist is deposited and patterned to form the emitter opening 28. Base oxide 24 is etched and the photoresist is removed to leave the emitter opening shown in FIG. 5. Then a layer of polycrystalline silicon (polysilicon) is deposited to a thickness of 2500 angstroms. The polysilicon layer is doped to n+ Type using one of several optional techniques, such as ion implantation, in situ doping, or any other suitable technique. In late processing, a portion of the doping from the polysilicon layer will diffuse into the surface of active base 26 to form n+ emitter 30. The polysilicon layer is then patterned to provide emitter poly 32, as shown in FIG. 6. A layer of TEOS oxide is deposited to a thickness of approximately 2500 angstroms followed by a plasma etch to form the TEOS sidewalls 34. The extrinsic base region 36 is then patterned and implanted with p-type ions such as boron, as shown in FIG. 7.

Next, a layer of platinum is sputter deposited. (A 0.05 um thick conformal platinum layer will produce a 0.1 um thick layer of silicide after reaction because Pt consumes about 1.3 times its own thickness of silicon to form PtSi about 2.0 times the original Pt thickness.) The temperature is raised to 450-535 degrees C. during this react process. The Pt reacts with the abutting silicon to form PtSi layers 38 and 40, shown in FIG. 8, but does not react with the abutting oxide. The unreacted platinum is stripped with aqua regia. Note that PtSi 38 forms ohmic junctions with p+ and n+ doped silicon, so the junction with p+ extrinsic base 36 is ohmic. However, the junction of PtSi 38 with n-type collector 10 forms a Schottky barrier diode. PtSi layer 40 is also formed over the surface of the emitter poly 32.

Figure 9:
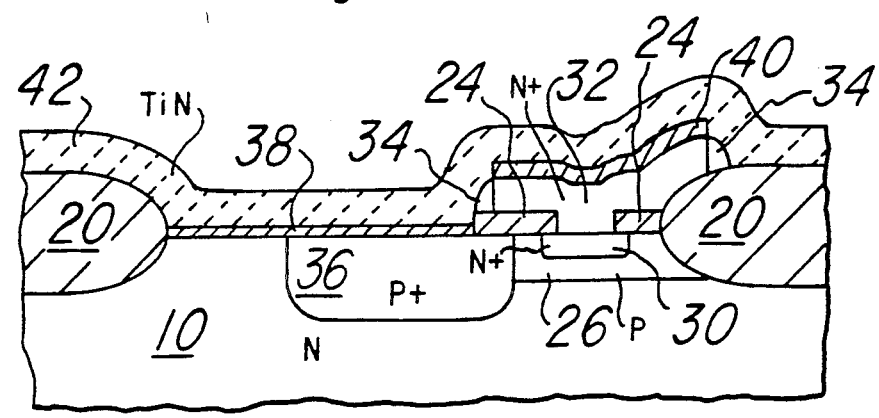

Titanium is then deposited over the circuit. The Ti is reacted with Ar+N2 to form TiN 42, as shown in FIG. 9. The ability of PtSi to survive the TiN react temperature should not be a problem. A paper by Eizenberg et al. in Applied Physics Letters, p. 547, 1980, shows that the barrier height for PtSi did not significantly change after a 600 degree C. anneal. Alternatively, the TiN can be reactively sputter deposited and the TiN react temperature will be avoided. The TiN 42 is covered with a patterned photoresist and etched (e.g. with carbon tetrachloride) to form etch-patterned TiN layer 42, shown in FIG. 1. The combination of the PtSi diode with the TiN interconnect provides an improvement over a TiSi2 diode with a TiN interconnect and a PtSi diode with a polysilicon interconnect. Note that other refractory metal layers could be deposited instead of TiN. Combining a PtSi diode with a TiN local interconnect has apparently never been done before.

The invention provides a PtSi Schottky diode on a bipolar transistor in combination with a TiN local interconnect with the advantages of (i) providing a TiN local interconnect which can be etched without also etching the PtSi, (ii) permitting a wide process window for overetching at contacts, (iii) a TiN local interconnect which is an improvement over a polysilicon local interconnect, and (iv) a high barrier Schottky diode which is preferred for clamping a bipolar transistor.

Although a specific embodiment of the present invention is herein described, it is not to be construed as limiting the scope of the present invention. Many embodiments of the present invention will become clear to those skilled in the art in light of the teachings of the specification. The scope of the invention is limited only by the claims appended hereto.

We claim:

1. A method of manufacturing an integrated circuit containing at least one bipolar silicon transistor, which transistor has adjacent base and collector regions; said method comprising:
    forming a self-aligned PtSi layer on said adjacent base and collector silicon regions, said PtSi serving as a clamp diode on the bipolar transistor,
    forming a TiN layer at least partially overlying said PtSi layer; and
    patterning and etching said TiN layer so as to form local interconnects and a PtSi Schottky diode on said bipolar transistor.

2. The method of claim 1, wherein said PtSi layer is formed by sputtering platinum onto a substrate having both oxide and silicon surface regions, heating said substrate to react said platinum with said silicon surface, and then removing said unreacted platinum with aqua regia.

3. The method of claim 1, wherein said etch-patterned TiN layer is formed by depositing titanium over said substrate and reacting said titanium with nitrogen to form titanium nitride, covering said titanium nitride with a patterned photoresist, and etching said titanium nitride to form the etch-patterned TiN.

4. The method of claim 1, wherein said titanium nitride is etched with carbon tetrachloride.

5. A method of manufacturing a bipolar transistor having a clamp diode and a TiN local interconnect, comprising the steps of:
    forming a base, collector and an emitter region in a semiconductor layer to create a bipolar transistor;
    forming a PtSi layer overlying said base and emitter regions to create a clamp diode; and
    forming a TiN layer partially overlying said base region to create a TiN local interconnect.

6. The method of claim 5 wherein the step of forming said TiN layer includes the steps of:
    depositing TiN over said base and emitter regions;
    etching away a portion of said TiN overlying said base region wherein said PtSi layer acts as an etch stop.

7. The method of claim 6 wherein said step of etching away a portion of said TiN comprises the step of etching with carbon tetrachloride.

8. The method of claim 5 wherein said base comprises a p-doped region and said collector comprises an n-doped region.

9. A method of forming an integrated circuit containing at least one bipolar silicon transistor comprising the steps of:
    forming a base region in the face of a silicon layer;
    forming a collector region in said face adjacent said base region;
    forming a self-aligned PtSi layer on said adjacent base and collector silicon regions said PtSi layer serving as a clamp diode on the bipolar transistor; and
    forming a local interconnect at least partially overlying said PtSi layer, said local interconnect comprising a TiN layer.

10. The method of claim 7 wherein said base comprises a p-doped region and said collector comprises an n-doped region.

11. The method of claim 9 wherein said local interconnect is formed such that it also overlies an oxide region.

12. A method of forming an integrated circuit structure comprising the steps of:
    providing a semiconductor substrate;
    forming a base region in said substrate, said base region including an extrinsic base portion extending to a surface of said substrate;
    forming an emitter region in said surface of said substrate adjacent said base region;
    forming a polycrystalline emitter region on said surface of said substrate overlying said emitter region;
    forming a first silicide layer in contact with said extrinsic base portion and forming a second silicide layer in contact with said polycrystalline emitter region; and
    forming a local interconnect region partially in contact with only part of said first silicide layer.

13. The method of claim 12 wherein said silicide layer comprises PtSi.

14. The method of claim 12 wherein said local interconnect region comprises TiN.

15. The method of claim 12 wherein said semiconductor substrate comprises a silicon substrate.

16. The method of claim 15 wherein said base region comprises a p-doped region and said emitter comprises an n-doped region and wherein said substrate comprises an n-doped collector region.

* * * * *